(12) United States Patent
Carducci et al.

(10) Patent No.: US 9,741,546 B2
(45) Date of Patent: Aug. 22, 2017

(54) SYMMETRIC PLASMA PROCESS CHAMBER

(71) Applicant: Applied Materials, Inc., Santa Clara, CA (US)

(72) Inventors: James D. Carducci, Sunnyvale, CA (US); Hamid Tavassoli, Cupertino, CA (US); Ajit Balakrishna, Sunnyvale, CA (US); Zhigang Chen, Campbell, CA (US); Andrew Nguyen, San Jose, CA (US); Douglas A. Buchberger, Jr., Livermore, CA (US); Kartik Ramaswamy, San Jose, CA (US); Shahid Rauf, Pleasanton, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 988 days.

(21) Appl. No.: 13/629,267

(22) Filed: Sep. 27, 2012

(65) Prior Publication Data
US 2013/0087286 A1 Apr. 11, 2013

Related U.S. Application Data

(60) Provisional application No. 61/543,565, filed on Oct. 5, 2011.

(51) Int. Cl.
*C23C 16/00* (2006.01)
*C23F 1/00* (2006.01)
(Continued)

(52) U.S. Cl.
CPC .... *H01J 37/3244* (2013.01); *H01J 37/32082* (2013.01); *H01J 37/32091* (2013.01);
(Continued)

(58) Field of Classification Search
CPC ...... H01J 37/32431–37/32513; H01J 37/3244; H01J 37/32724; H01J 37/32733;
(Continued)

(56) References Cited

U.S. PATENT DOCUMENTS 5,800,621 A 9/1998 Redeker et al.
5,820,723 A * 10/1998 Benjamin ............... H01J 37/16
118/723 E
(Continued)

FOREIGN PATENT DOCUMENTS

CN 1723530 A 1/2006
CN 1802066 A 7/2006
(Continued)

OTHER PUBLICATIONS

Prior art search report dated Apr. 25, 2013 for Korean Application No. 2012-0107823.
(Continued)

*Primary Examiner* — Rakesh Dhingra
(74) *Attorney, Agent, or Firm* — Patterson + Sheridan, LLP (57) ABSTRACT

Embodiments of the present invention provide a plasma chamber design that allows extremely symmetrical electrical, thermal, and gas flow conductance through the chamber. By providing such symmetry, plasma formed within the chamber naturally has improved uniformity across the surface of a substrate disposed in a processing region of the chamber. Further, other chamber additions, such as providing the ability to manipulate the gap between upper and lower electrodes as well as between a gas inlet and a substrate being processed, allows better control of plasma processing and uniformity as compared to conventional systems.

17 Claims, 3 Drawing Sheets

(51) Int. Cl.
*H01L 21/306* (2006.01)
*H01J 37/32* (2006.01)
*H05H 1/46* (2006.01)

(52) U.S. Cl.
CPC .. *H01J 37/32495* (2013.01); *H01J 37/32541* (2013.01); *H01J 37/32568* (2013.01); *H01J 37/32724* (2013.01); *H01J 37/32733* (2013.01); *H01J 37/32743* (2013.01); *H01J 37/32834* (2013.01); *H05H 1/46* (2013.01); *H01J 2237/3321* (2013.01); *H01J 2237/3323* (2013.01); *H01J 2237/3344* (2013.01)

(58) Field of Classification Search
CPC ........... H01J 37/32743; H01J 37/32834; H01J 37/32568; H01J 37/32082; H01J 37/32541; H01J 37/32091; H01J 2237/3344; H01J 2237/332; H05H 1/44; H05H 1/46
USPC .......... 156/345.33, 345.34, 345.51; 118/715, 118/728
See application file for complete search history.

(56) References Cited

U.S. PATENT DOCUMENTS

| | | | |
|---|---|---|---|
| 5,838,528 | A | 11/1998 | Os et al. |
| 5,948,704 | A | 9/1999 | Benjamin et al. |
| 6,083,344 | A | 7/2000 | Hanawa et al. |
| 6,170,428 | B1 | 1/2001 | Redeker et al. |
| 6,182,602 | B1 | 2/2001 | Redeker et al. |
| 6,189,483 | B1 | 2/2001 | Ishikawa et al. |
| 6,264,788 | B1 | 7/2001 | Tomoyasu et al. |
| 6,416,823 | B2 | 7/2002 | Li et al. |
| 6,517,634 | B2 | 2/2003 | Pang et al. |
| 6,545,420 | B1 | 4/2003 | Collins et al. |
| 6,572,708 | B2 | 6/2003 | Gujer et al. |
| 6,664,738 | B2 | 12/2003 | Arai et al. |
| 6,704,913 | B2 | 3/2004 | Rossman |
| 7,432,467 | B2 | 10/2008 | Yamazawa |
| 2001/0008172 | A1* | 7/2001 | Shoda ............... H01L 21/67109 156/345.53 |
| 2004/0050327 | A1 | 3/2004 | Johnson et al. |
| 2004/0182515 | A1* | 9/2004 | Sato ................... C03C 15/00 156/345.43 |
| 2005/0139321 | A1 | 6/2005 | Higashiura et al. |
| 2005/0150757 | A1 | 7/2005 | Black et al. |
| 2007/0065598 | A1 | 3/2007 | Wolf |
| 2007/0215044 | A1 | 9/2007 | Yamazawa |
| 2008/0029032 | A1* | 2/2008 | Sun .................... H01L 21/6833 118/728 |
| 2008/0138535 | A1 | 6/2008 | Hwang |
| 2008/0171444 | A1 | 7/2008 | Dhindsa et al. |
| 2008/0178797 | A1 | 7/2008 | Fodor et al. |
| 2008/0223523 | A1 | 9/2008 | Handa |
| 2009/0065486 | A1 | 3/2009 | Yamashita |
| 2009/0162260 | A1 | 6/2009 | Bera et al. |
| 2009/0162262 | A1* | 6/2009 | Bera ................... H01J 37/32449 422/186.04 |
| 2009/0194264 | A1 | 8/2009 | Sasaki |
| 2009/0250169 | A1* | 10/2009 | Carducci ........... H01J 37/32082 156/345.34 |
| 2010/0186672 | A1* | 7/2010 | Okuda ............... C23C 16/4586 118/723 R |
| 2010/0186674 | A1 | 7/2010 | Cahill, Jr. et al. |
| 2010/0248490 | A1 | 9/2010 | McMillin et al. |
| 2011/0104902 | A1 | 5/2011 | Yamazawa et al. |
| 2011/0233170 | A1 | 9/2011 | Yamazawa |
| 2011/0290419 | A1* | 12/2011 | Horiguchi ........... H01J 37/3244 156/345.29 |
| 2012/0018402 | A1 | 1/2012 | Carducci et al. |
| 2012/0073756 | A1 | 3/2012 | Yamazawa |
| 2012/0247679 | A1 | 10/2012 | Yamazawa |

FOREIGN PATENT DOCUMENTS

| | | |
|---|---|---|
| CN | 1812682 A | 8/2006 |
| CN | 101118865 A | 2/2008 |
| CN | 101202212 A | 6/2008 |
| CN | 101504928 A | 8/2009 |
| CN | 101740340 A | 6/2010 |
| CN | 101802272 A | 8/2010 |
| CN | 101809717 A | 8/2010 |
| CN | 103050362 A | 4/2013 |
| CN | 103050363 A | 4/2013 |
| JP | S58-041658 | 12/1980 |
| JP | H03-83334 A | 4/1991 |
| JP | H06-295866 A | 10/1994 |
| JP | 2001-93884 | 4/2001 |
| JP | 2002-016044 | 1/2002 |
| JP | 2002-343787 | 11/2002 |
| JP | 2002-367965 A | 12/2002 |
| JP | 2004-039844 A | 2/2004 |
| JP | 2004-193566 A | 7/2004 |
| JP | 2005-123578 A | 5/2005 |
| JP | 2007266533 | 10/2007 |
| JP | 2008-42197 A | 2/2008 |
| JP | 2008-227064 A | 9/2008 |
| JP | 2008226857 A | 9/2008 |
| JP | 2008244233 | 10/2008 |
| JP | 2008-300410 A | 12/2008 |
| JP | 2008-306212 A | 12/2008 |
| JP | 2009-224432 | 10/2009 |
| JP | 2009231687 | 10/2009 |
| JP | 2010-171286 A | 8/2010 |
| JP | 2012-222719 A | 11/2012 |
| JP | 2013-179055 | 9/2013 |
| JP | 2013-211268 | 10/2013 |
| JP | 2013-211269 | 10/2013 |
| KR | 2001-0071717 | 7/2001 |
| KR | 2002/0075123 | * 10/2002 |
| KR | 2010-0121985 | 11/2010 |
| TW | 520621 B | 2/2003 |
| TW | 250219 | 3/2006 |
| TW | 200913051 | 3/2006 |
| TW | I250219 | 3/2006 |
| TW | 200917414 A | 4/2009 |
| TW | 200941566 | 10/2009 |
| TW | 200946236 A | 11/2009 |
| TW | 200946236 A | 11/2009 |
| TW | 200947172 | 11/2009 |
| TW | 200947592 | 11/2009 |
| TW | 201034524 | 9/2010 |
| TW | 201108349 | 3/2011 |
| TW | 201316846 A | 4/2013 |
| TW | 201325324 | 6/2013 |
| TW | 201325325 | 6/2013 |
| WO | 2009/044693 A1 | 4/2009 |

OTHER PUBLICATIONS

Notice of Office Action dated Aug. 5, 2013 for Korean Patent Application No. 10-2012-0107823.
Official Letter dated Dec. 30, 2016, from China Patent Office for corresponding China Patent Application No. 2012105496574.
Chinese Office Action (with attached English translation) for Application No. 201210548832.8; dated Mar. 2, 2016; 17 total pages.
Chinese Office Action dated Mar. 1, 2016 for Chinese Patent Application No. 201210548948.1; 7 pages (including translation).
Chinese Office Action in related application 201210391087.0 dated Dec. 22, 2015.
TW Office Action dated Jun. 14, 2016 for Application No. 102107023.
TW Office Action dated Jun. 14, 2016 for Application No. 101134512.
TW Office Action dated Jun. 15, 2016 for Application No. 102107011.
TW Office Action dated Jun. 15, 2016 for Application No. 102107021.
Office Action from Taiwan Patent Application No. 102107016 dated Jun. 7, 2016.

(56) References Cited

OTHER PUBLICATIONS

Japanese Office Action dated Jul. 26, 2016 for Application No. 2012-222719.
Japanese Office Action dated Jul. 26, 2016 for Application No. 2013-079051.
Japanese Office Action dated Jul. 26, 2016 for Application No. 2013-079053.
Japanese Office Action dated Jul. 26, 2016 for Application No. 2013-079172.
Japanese Office Action dated Jul. 26, 2016 for Applicatio No. 2013-079246.
TW Office Action dated Nov. 2, 2016 for Application No. 101134512.
Chinese Office Action dated Oct. 9, 2016 for Application No. 201210391087.0.
TW Office Action dated Oct. 28, 2016 for Application No. 102107023.
TW Office Action dated Oct. 31, 2016 for Application No. 102107011.
Office Action for Chinese Patent Application No. 201210548832.8 dated Apr. 5, 2017.

\* cited by examiner

SYMMETRIC PLASMA PROCESS CHAMBER

CROSS-REFERENCE TO RELATED APPLICATIONS

This application claims benefit of U.S. provisional patent application Ser. No. 61/543,565, filed Oct. 5, 2011, which is incorporated herein by reference.

BACKGROUND OF THE INVENTION

Field of the Invention

The present invention generally relates to a plasma processing apparatus for fabricating substrates in which plasma is excited by RF power applied between electrodes. More specifically, the present invention relates to a plasma processing chamber that provides electrical, gas flow, and thermal symmetry for improved plasma uniformity control.

Description of the Related Art

Electronic devices, such as flat panel displays and integrated circuits commonly are fabricated by a series of process steps in which layers are deposited on a substrate and the deposited material is etched into desired patterns. The process steps commonly include physical vapor deposition (PVD), chemical vapor deposition (CVD), plasma enhanced CVD (PECVD), and other plasma processing. Specifically, a plasma process requires supplying a process gas mixture to a vacuum chamber, and applying electrical or electromagnetic power (RF power) to excite the process gas into a plasma state. The plasma decomposes the gas mixture into ion species that perform the desired deposition or etch processes.

One problem encountered with plasma processes is the difficulty associated with establishing uniform plasma density over the substrate surface during processing, which leads to non-uniform processing between the center and edge regions of the substrate. One reason for the difficulty in establishing uniform plasma density involves natural electrical, gas flow, and thermal skews due to asymmetry in the physical process chamber design. Such skews not only result in naturally, azimuthal, non-uniform plasma density, but also make it difficult to use other processing variables or "knobs" to control center-to-edge plasma uniformity.

Therefore, a need exists for a plasma processing apparatus that improves electrical, gas flow, and thermal symmetry for improved plasma uniformity control.

SUMMARY OF THE INVENTION

In one embodiment of the present invention, a plasma processing apparatus is provided that comprises a lid assembly and a chamber body enclosing a processing region. A substrate support assembly is disposed in the chamber body. An exhaust assembly defining an evacuation region within the chamber body is provided. The chamber body includes a plurality of passages symmetrically disposed about a central axis of the substrate support assembly fluidly connecting the processing region with the evacuation region. The substrate support assembly comprises a lower electrode and a support pedestal disposed in a central region fluidly sealed from the processing and evacuation regions. A plurality of access tubes are positioned through the chamber body to provide access to the central region and arranged symmetrically about the central axis of the substrate support assembly.

In another embodiment, a plasma processing apparatus comprises a lid assembly and a chamber body enclosing a processing region. A substrate support assembly is disposed in the chamber body. The lid assembly comprises an upper electrode having a central manifold configured to distribute processing gas into the processing region and one or more outer manifolds configured to distribute processing gas into the processing region. The lid assembly also comprises a ring manifold coupled to the one or more outer manifolds via a plurality of gas tubes arranged symmetrically about a central axis of the substrate support assembly.

In yet another embodiment, a plasma processing apparatus comprises a lid assembly and a chamber body enclosing a processing region. A substrate support assembly is disposed in the chamber body. An upper liner is disposed within the chamber body circumscribing the processing region. The upper liner has a cylindrical wall with a plurality of slots disposed therethrough and arranged symmetrically about a central axis of the substrate support assembly. A backing liner is coupled to the cylindrical wall covering at least one of the plurality of slots. A a mesh liner annularly disposed about the substrate support assembly and electrically coupled to the upper liner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

As previously mentioned, a problem in conventional plasma systems is the difficulty in providing uniform plasma density due to asymmetry in the chamber. Embodiments of the present invention mitigate this problem by providing a chamber design that allows extremely symmetrical electrical, thermal, and gas flow conductance through the chamber. By providing such symmetry, plasma formed within the chamber naturally has improved uniformity across the surface of a substrate disposed in a processing region of the chamber. Further, other chamber additions, such as providing the ability to manipulate the gap between upper and lower electrodes as well as between a gas inlet and a substrate being processed, provides a large process window that enables better control of plasma processing and uniformity as compared to conventional systems.

Figure 1:
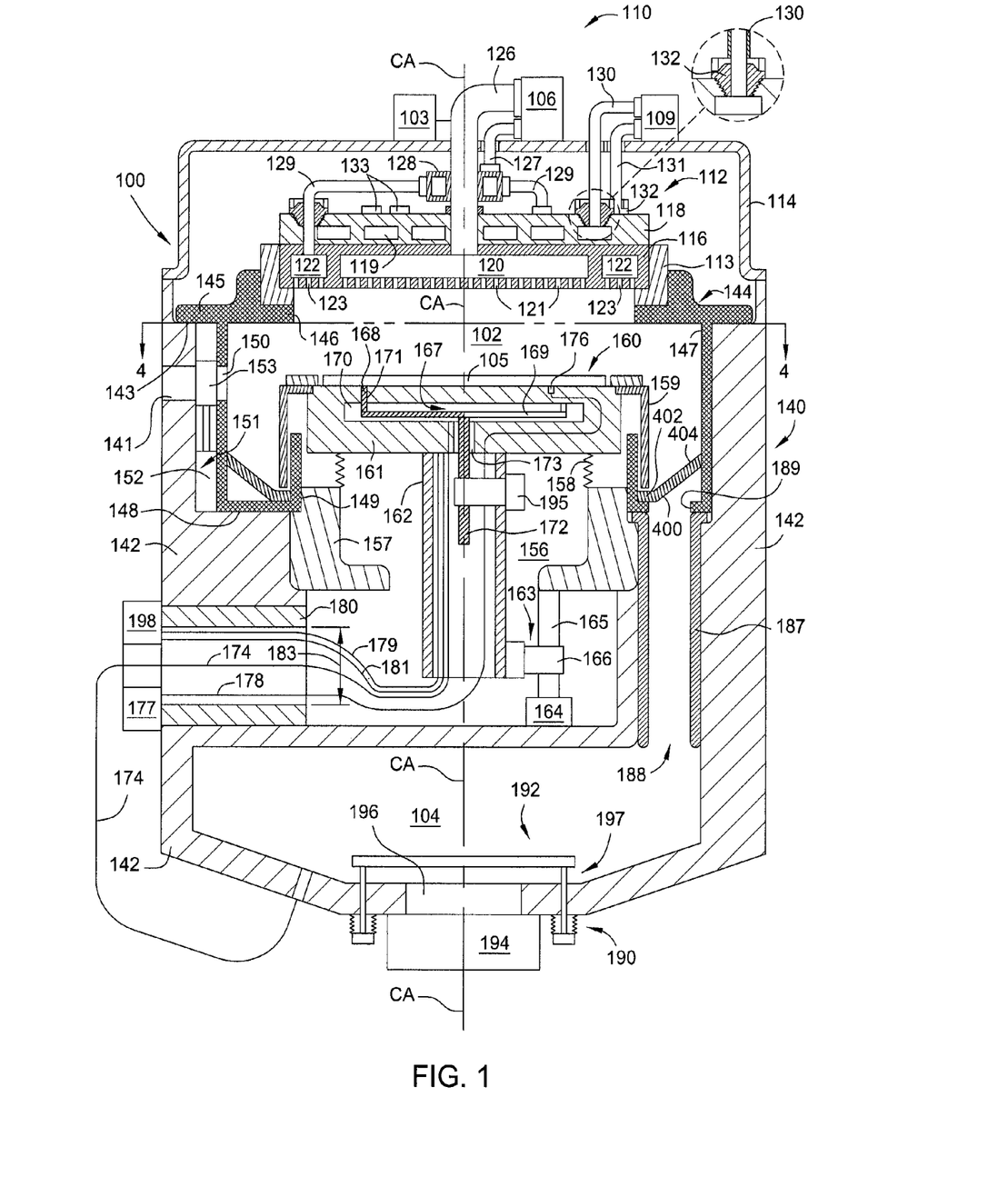
FIG. 1 is a schematic, cross-sectional view of a plasma processing apparatus according to one embodiment of the present invention.

FIG. 1 is a schematic, cross-sectional view of a plasma processing apparatus 100 according to one embodiment of the present invention. The plasma processing apparatus 100 may be a plasma etch chamber, a plasma enhanced chemical vapor deposition chamber, a physical vapor deposition chamber, a plasma treatment chamber, an ion implantation chamber, or other suitable vacuum processing chamber. As shown in FIG. 1, the plasma processing apparatus 100 generally includes a chamber lid assembly 110, a chamber body assembly 140, and an exhaust assembly 190, which collectively enclose a processing region 102 and an evacuation region 104. In practice, processing gases are introduced into the processing region 102 and ignited into a plasma using RF power. A substrate 105 is positioned on a substrate support assembly 160 and exposed to the plasma generated in the processing region 102 to perform a plasma process on the substrate 105, such as etching, chemical vapor deposition, physical vapor deposition, implantation, plasma annealing, plasma treating, abatement, or other plasma processes. Vacuum is maintained in the processing region 102 by the exhaust assembly 190, which removes spent processing gases and byproducts from the plasma process through the evacuation region 104.

Figure 2:
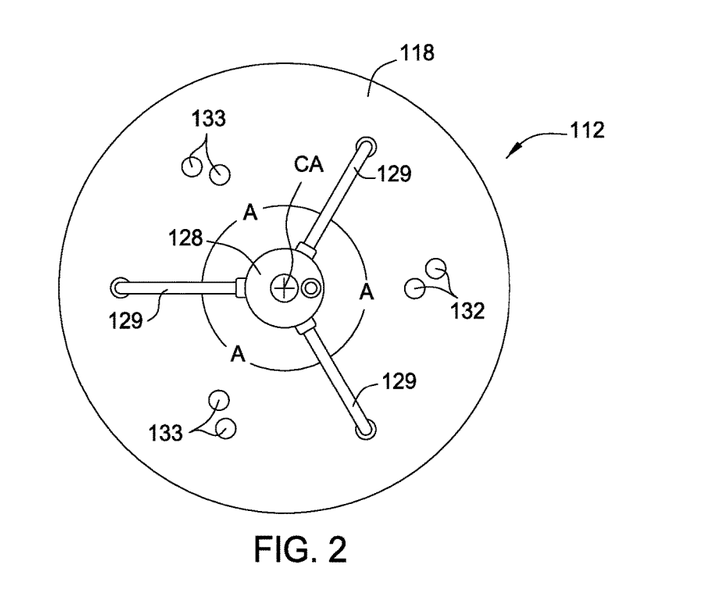
FIG. 2 is a schematic, top view of an upper electrode of the processing apparatus of FIG. 1.

The lid assembly 110 generally includes an upper electrode 112 (or anode) isolated from and supported by the chamber body assembly 140 and a chamber lid 114 enclosing the upper electrode 112. FIG. 2 is a schematic, top view of the upper electrode 112. The upper electrode 112 is coupled to an RF power source 103 via a conductive gas inlet tube 126. The conductive gas inlet tube 126 is coaxial with a central axis (CA) of the chamber body assembly 140 so that both RF power and processing gases are symmetrically provided. The upper electrode 112 includes a showerhead plate 116 attached to a heat transfer plate 118. The showerhead plate 116, the heat transfer plate 118, and the gas inlet tube 126 are all fabricated from a RF conductive material, such as aluminum or stainless steel.

The showerhead plate 116 has a central manifold 120 and one or more outer manifolds 122. The one or more outer manifolds 122 circumscribe the central manifold 120. The central manifold 120 receives processing gases from a gas source 106 through the gas inlet tube 126 and distributes the received processing gases into a central portion of the processing region 102 through a plurality of gas passages 121. The outer manifold(s) 122 receives processing gases, which may be the same or a different mixture of gases received in the central manifold 120, from the gas source 106. The outer manifold(s) 122 then distributes the received processing gases into an outer portion of the processing region 102 through a plurality of gas passages 123. The manifolds 120, 122 have sufficient volume to function as a plenum so that uniform pressure is provided to each gas passage 121 associated with a respective manifold 120, 122. The dual manifold configuration of the showerhead plate 116 allows improved control of the delivery of gases into the processing region 102. For instance, processing gases provided to the central portion of the processing region 102, and thus the central portion of the substrate 105 positioned therein, may be introduced at a different flow rate and/or pressure than the processing gases provided to the outer portion of the processing region 102, and thus outer portion of the substrate 105. The multi-manifold showerhead plate 116 enables enhanced center to edge control of processing results as opposed to conventional single manifold versions.

Referring to FIGS. 1 and 2, it can be seen that a processing gas from the gas source 106 is delivered through an inlet tube 127 into a ring manifold 128 concentrically disposed around the inlet tube 126. From the ring manifold 128, the processing gas is delivered through a plurality of gas tubes 129 to the outer manifold(s) 122. In one embodiment, the ring manifold 128 includes a recursive gas path to assure that gas flows equally from the ring manifold 128 into the gas tubes 129. The ring manifold 128 and the gas tubes 129 are fabricated from a conductive material, such as aluminum or stainless steel. Thus, the ring manifold 128 and the gas tubes 129 may influence the symmetry of the RF current, causing skewing of the electric field provided by the upper electrode 112, potentially resulting in an effect in the plasma uniformity within the process region 102.

To prevent such skewing in the electric field, the gas tubes 129 are positioned symmetrically about the central axis (CA) extending vertically through the processing apparatus 100. Thus, the gas tubes 129 extend from the centrally located ring manifold 128 at equidistant angles (A) to deliver the processing gas through the cooling plate 118 and into the outer manifold(s) 122. For example, the embodiment shown in FIG. 2 depicts three gas tubes 129 spaced apart by 120 degree angles. In other examples (not shown), more or fewer gas tubes 129 may be used as long as they are positioned symmetrically about the central axis (CA), i.e., at equidistant angles (A) from one another. By employing a ring-shaped manifold and arranging the gas tubes 129 symmetrically about the central axis (CA), the electrical symmetry of the upper electrode 112 is significantly improved over conventional systems resulting in more uniform and consistent plasma formation in the processing region 102. Additionally, the symmetric arrangement of the gas tubes 129 provides gas in a uniformly polar array into the outer manifold 122, thereby providing azimuthal uniform pressure distribution within the outer manifold 122 and consequently, an azimuthally uniform flow of gas through the gas passages 123 into the processing region 102, thereby enhancing processing uniformity.

A heat transfer fluid is delivered from a fluid source 109 to the heat transfer plate 118 through a fluid inlet tube 130. The fluid is circulated through one or more fluid channels 119 disposed in the heat transfer plate 118 and returned to the fluid source 109 via a fluid outlet tube 131. Suitable heat transfer fluids include water, water-based ethylene glycol mixtures, a perfluoropolyether (e.g., Galden® fluid), oil-based thermal transfer fluids, or similar fluids.

The fluid inlet tube 130 and fluid outlet tube 131 are each fabricated from a non-conductive material, such as a suitable plastic material. Thus, the tubes themselves do not affect the electrical symmetry of the upper electrode 112. However, the fittings 132 are fabricated from a conductive material, such as aluminum or stainless steel, and thus may affect the electrical symmetry of the upper electrode 112 causing a skewing effect. Thus, conductive plugs 133, fabricated from the same material and having the same size and shape as the fittings 132, are disposed symmetrically about the central axis (CA) as shown in FIG. 2 such that the plugs 133 and fittings 132 together define a polar array centered about the central axis (CA) of the chamber body assembly 140. The addition of the conductive plugs 133 improve the electrical symmetry of the upper electrode 112, resulting in more uniform and consistent plasma formation in the processing region 102 than available in conventional systems.

Referring back to FIG. 1, the chamber body assembly 140 includes a chamber body 142 fabricated from a conductive material resistant to processing environments, such as aluminum or stainless steel. The substrate support assembly 160 is centrally disposed within the chamber body 142 and positioned to support the substrate 105 in the processing region 102 symmetrically about the central axis (CA).

Figure 3A:
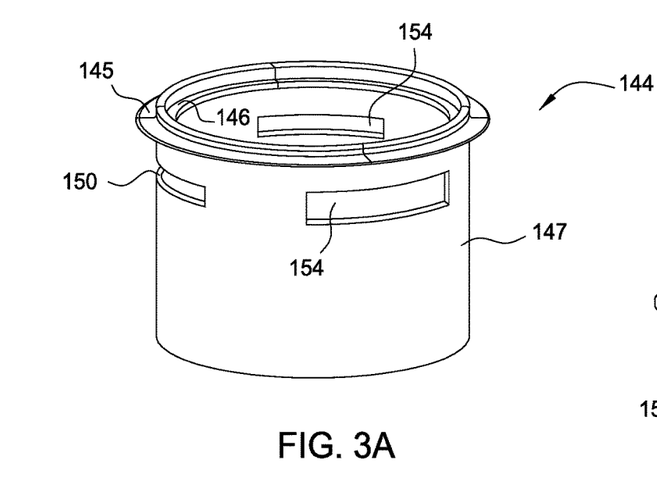
FIG. 3A is a schematic, isometric view of an upper liner assembly that is disposed within an upper portion of a chamber body circumscribing a processing region of the processing apparatus of FIG. 1.

FIG. 3A is a schematic, isometric view of an upper liner assembly 144 that is disposed within an upper portion of the chamber body 142 circumscribing the processing region 102. The upper liner assembly 144 may be constructed from a conductive, process compatible material, such as aluminum, stainless steel, and/or yttria (e.g., yttria coated aluminum). In practice, the upper liner assembly 144 shields the upper portion of the chamber body 142 from the plasma in the processing region 102 and is removable to allow periodic cleaning and maintenance. In one embodiment, the upper liner assembly 144 is temperature controlled, such as by an AC heater (not shown) in order to enhance the thermal symmetry within the chamber and symmetry of the plasma provided in the processing region 102.

Referring to FIGS. 1 and 3A, the chamber body 142 includes a ledge 143 that supports an outer flange 145 of the upper liner assembly 144. An inner flange 146 of the upper liner assembly 144 supports the upper electrode 112. An insulator 113 is positioned between the upper liner assembly 144 and the upper electrode 112 to provide electrical insulation between the chamber body assembly 140 and the upper electrode 112.

The upper liner assembly 144 includes an outer wall 147 attached to the inner and outer flanges (146,145), a bottom wall 148, and an inner wall 149. The outer wall 147 and inner wall 149 are substantially vertical, cylindrical walls. The outer wall 147 is positioned to shield chamber body 142 from plasma in the processing region 102, and the inner wall 149 is positioned to at least partially shield the side of the substrate support assembly 160 from plasma in the processing region 102. The bottom wall 148 joins the inner and outer walls (149, 147) except in certain regions where evacuation passages 189 are formed, which are subsequently discussed herein.

Referring back to FIG. 1, the processing region 102 is accessed through a slit valve tunnel 141 disposed in the chamber body 142 that allows entry and removal of the substrate 105 into/from the substrate support assembly 160. The upper liner assembly 144 has a slot 150 disposed therethrough that matches the slit valve tunnel 141 to allow passage of the substrate 105 therethrough. The chamber body assembly 140 includes a slit valve door assembly 151 that includes an actuator 152 positioned and configured to vertically extend a slit valve door 153 to seal the slit valve tunnel 141 and slot 150 and to vertically retract the slit valve door 153 to allow access through the slit valve tunnel 141 and slot 150. The slit valve door assembly 151 and its components are not hatched in FIG. 1 in order to minimize drawing clutter. The slit valve door 153 may be constructed of a material substantially matching that of the upper liner assembly 144 (e.g., yttria coated aluminum) in order to provide increased electrical symmetry in the liner. In one embodiment, the slit valve door 153 is temperature controlled, such as by an AC heater (not shown), to match the temperature of the upper liner assembly 144 to provide increased thermal symmetry in the processing region 102.

Referring to FIG. 3A, additional slots 154, substantially matching the size and shape of slot 150, are disposed through the upper liner assembly 144. The slots 154 are disposed through the upper liner assembly 144 symmetrically about the central axis (CA). For example, as shown in FIG. 3A, two slots 154 are disposed at angles of 120 degrees from the slot 150, such that the slot 150 and slots 154 form a polar array about the central axis (CA). The slots 154 are disposed symmetrically about the upper liner assembly 144 in order to compensate for changes in the electrical current density and/or distribution present in the upper liner assembly 144 due to the presence of the slot 150. In addition, the slots 150 and 154 may be positioned in line with respective gas tubes 129 to provide improved electrical symmetry in the chamber.

Figure 3B:
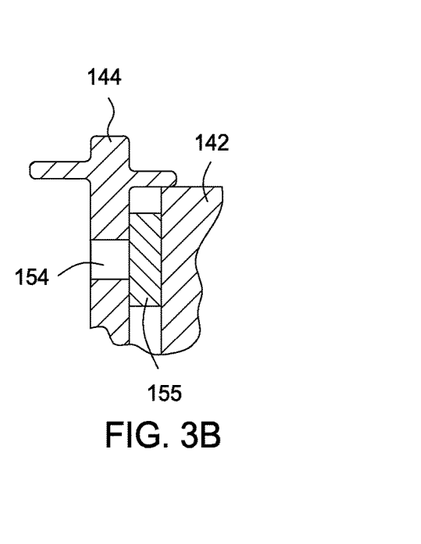
FIG. 3B is a partial, cross-sectional view of a portion of the chamber body and the upper liner assembly.

FIG. 3B is a partial, cross-sectional view of a portion of the chamber body 142 and the upper liner assembly 144. Backing liners 155 may be provided, attached to and covering, the slots 154 of the upper liner assembly 144. The backing liners 155 are sized, shaped, and constructed of materials to mimic the slit valve door 153. The backing liners 155 are also in conductive contact with the upper liner assembly 144 to maintain electrical and thermal contact with the upper liner assembly 144. Thus, the backing liners 155 further provide electrical as well as thermal symmetry about the upper liner assembly 144 in order to enable more uniform plasma density within the processing region 102 than is available with conventional systems.

Figure 4:
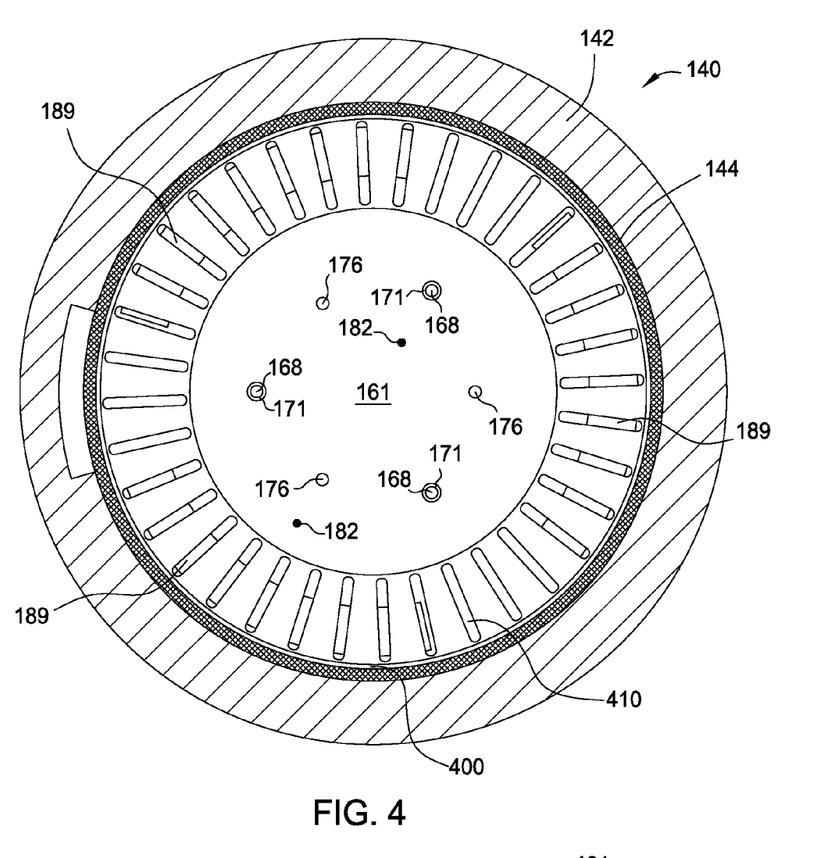
FIG. 4 is a schematic view of the processing apparatus taken along line 4-4 shown in FIG. 1.

FIG. 4 is a schematic view of the processing apparatus 100 taken along line 4-4 shown in FIG. 1 with the substrate 105 removed for clarity. Referring to FIGS. 1 and 4, the substrate support assembly 160 is disposed centrally within a central region 156 of the chamber body assembly 140 and sharing the central axis (CA). That is, the central axis (CA) passes vertically through the center of the substrate support assembly 160. The substrate support assembly 160 generally includes lower electrode 161 (or cathode) and a hollow pedestal 162, the center of which the central axis (CA) passes through, and is supported by a central support member 157 disposed in the central region 156 and supported by the chamber body 142. The central axis (CA) also passes through the center of the central support member 157. The lower electrode 161 is coupled to the RF power source 103 through a matching network (not shown) and a cable (not shown) routed through the hollow pedestal 162 as will be subsequently described. When RF power is supplied to the upper electrode 112 and the lower electrode 161, an electrical field formed therebetween ignites the processing gases present in the processing region 102 into a plasma.

The central support member 157 is sealed to the chamber body 142, such as by fasteners and o-rings (not shown), and the lower electrode 161 is sealed to the central support member 157, such as by a bellows 158. Thus, the central region 156 is sealed from the processing region 102 and may be maintained at atmospheric pressure, while the processing region 102 is maintained at vacuum conditions.

An actuation assembly 163 is positioned within the central region 156 and attached to the chamber body 142 and/or the central support member 157. Note, the actuation assembly 163 is shown without hatching to minimize drawing clutter. The actuation assembly 163 includes an actuator 164 (e.g., motor), a lead screw 165, and a nut 166 attached to the pedestal 162. In practice, the actuator 164 rotates the lead screw 165, which, in turn raises or lowers the nut 166, and thus the pedestal 162. Since the lower electrode 161 is supported by the pedestal 162, the actuation assembly 163 provides vertical movement of the lower electrode 161 relative to the chamber body 142, the central support member 157, and the upper electrode 112. Such vertical movement of the lower electrode 161 within the processing region 102 provides a variable gap between the lower electrode 161 and the upper electrode 112, which allows increased control of the electric field formed therebetween, in turn, providing greater control of the density in the plasma formed in the processing region 102. In addition, since the substrate 105 is supported by the lower electrode 161, the gap between the substrate 105 and the showerhead plate 116 may also be varied, resulting in greater control of the process gas distribution across the substrate 105.

A plasma screen 159 is also provided, supported by the lower electrode 161 and overlapping the inner wall 149 of the upper liner assembly 144, to protect the substrate support assembly 160 and the bellows 158 from the plasma in the processing region 102. Since the plasma screen 159 is coupled to and moves vertically with the pedestal 162, the overlap between plasma screen 159 the inner wall 149 of the upper liner assembly 144 is sufficient to allow the pedestal 162 to enjoy a full range of motion without the plasma screen 159 and the upper liner assembly 144 becoming disengaged and allowing exposure of the region below the pedestal 162 to become exposed to process gases.

The substrate support assembly 160 further includes a lift pin assembly 167 to facilitate loading and unloading of the substrate 105. The lift pin assembly 167 includes lift pins 168 attached to a lift pin plate 169. The lift pin plate 169 is disposed within an opening 170 within the lower electrode 161, and the lift pins 168 extend through lift pin holes 171 disposed between the opening 170 and the processing region 102. The lift pin plate 169 is coupled to a lead screw 172 extending through an aperture 173 in the lower electrode 161 and into the hollow pedestal 162. An actuator 195 (e.g., motor) may be positioned on the pedestal 162. Note, the actuator 195 is shown without hatching to minimize drawing clutter. The actuator 195 rotates a nut, which advances or retracts the lead screw 172. The lead screw 172 is coupled to the lift pin plate 169. Thus, as the actuator 195 causes the lead screw 172 to raise or lower the lift pin plate 169, the lift pins 168 to extend or retract. Therefore, the actuator 195 allows the lift pins 168 to be extended or retracted regardless of the vertical positioning of the lower electrode 161. By providing such separate actuation of the lift pins 168, the vertical positioning of the substrate 105 can be altered separately from the vertical positioning of the lower electrode 161 allowing greater control of positioning during both loading and unloading of the substrate 105 as well as during processing of the substrate 105, for example, by lifting the substrate during processing to allow backside gas to escape from under the substrate.

The substrate support assembly 160 further includes a vent line 174 coupling the opening 170 with the exhaust region 104. The vent line 174 is routed centrally through the hollow pedestal 162 and out of the chamber body 142 through one of a plurality of access tubes 180 arranged in a spoke pattern symmetrical about the central axis (CA) as subsequently described. The vent line 174 provides for evacuation of the opening 170 in order to remove any processing gases that may leak into the opening 170 via the lift pin holes 171. In addition, evacuation of the opening 170 also aids in removing any processing gases that may be present on the backside of the substrate 105 disposed on the lower electrode 161 or lift pins 168.

The substrate support assembly 160 may also include a gas port 176 disposed therethrough and coupled to an inert gas supply 177 via a gas supply line 178. The gas supply 177 supplies an inert gas, such as helium, through the gas supply line 178 and the gas port 176 to the backside of the substrate 105 in order to help prevent processing gases from processing the backside of the substrate 105. The gas supply line 178 is also routed through the hollow pedestal 162 and out of the chamber body 142 through one of the plurality of access tubes 180.

The substrate support assembly 160 may further include one or more fluid inlet lines 179 and fluid outlet lines 181 routed from a heat exchange fluid source 198 to through one or more heat exchange channels (not shown) in the lower electrode 161 in order to provide temperature control to the lower electrode 161 during processing. The fluid inlet lines 179 and fluid outlet lines 181 are routed from the lower electrode 161 through the hollow pedestal 162 and out of the chamber body 142 through one of the plurality of access tubes 180.

In one embodiment, the substrate support assembly 160 may further include one or more temperature sensors 182 disposed in the lower electrode 161 to facilitate temperature control of the lower electrode 161.

In one embodiment, the lower electrode 161 is an electrostatic chuck, and thus includes one or more electrodes (not shown) disposed therein. A voltage source (not shown) biases the one or more electrodes with respect to the substrate 105 to create an attraction force to hold the substrate 105 in position during processing. Cabling coupling the one or more electrodes to the voltage source is routed through the hollow pedestal 162 and out of the chamber body 142 through one of the plurality of access tubes 180.

Figure 5:
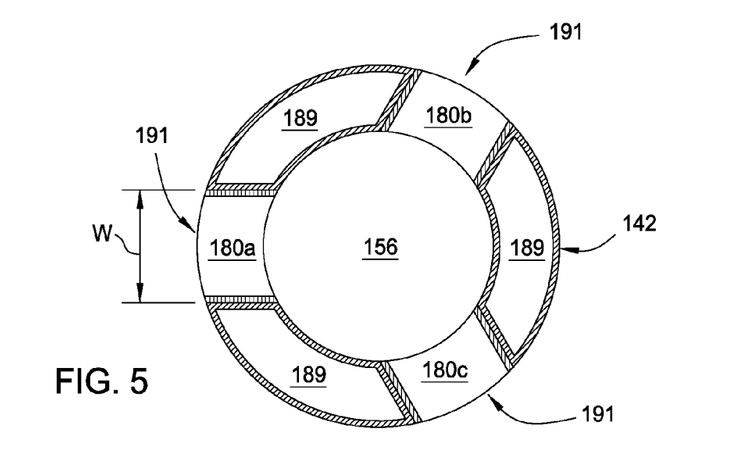
FIG. 5 is a schematic depiction of the layout of access tubes extending through the processing apparatus of FIG. 1.

FIG. 5 is a schematic depiction of the layout of the access tubes 180 within spokes 191 of the chamber body assembly 140. Referring to FIGS. 1 and 5, the spokes 191 and access tubes 180 are symmetrically arranged about the central axis (CA) of the processing apparatus 100 in a spoke pattern as shown. In the embodiment shown, three identical access tubes 180 are disposed through the chamber body 142 into the central region 156 to facilitate supply of a plurality of tubing and cabling from outside of the chamber body 142 to the lower electrode 161. In order to facilitate vertical movement of the lower electrode 162, the opening 183 through each of the access tubes 180 is approximately equal to the vertical travel of the lower electrode 161. For example, in one configuration, the lower electrode 162 is vertically movable a distance of approximately 7.2 inches. In this case, the height of the opening 183 in each of the access tubes 180 is also approximately 7.2 inches. Keeping these distances approximately the same helps minimize the length of the cabling required as well as preventing binding and wear of the cabling during vertical movement of the lower electrode 161. In addition, the width (W) of the spokes 191 is minimized such that a high aspect ratio (height:width) is provided, such that the open area for evacuation passages 189 is enhanced, while still allowing sufficient room for utilities (e.g., gas, wiring). Such a configuration reduces flow resistance of exhaust gases, resulting in reduced energy consumption due to pumping and smaller less costly pumps.

In order to further facilitate cable routing to the lower electrode 161, the cable routing is divided between the plurality of access tubes 180. For example, the fluid lines (179, 181), the gas supply line 178, and the vacuum tube 174 may all be provided through the access tube 180a; cables for the temperature sensors 184 and other electrical cables (e.g., to actuators 164, 195) may be provided through the access tube 180b; and the RF voltage feed and other electrical cable(s) (e.g., to electrodes for chucking function) may be provided through the access tube 180c. Thus, number and volume of cabling from outside of the chamber body 142 to the lower electrode 162 are divided between the access tubes 180 in order to minimize the size of the access tubes 180 while providing adequate clearance to facilitate the movement of the lower electrode 161.

The access tubes 180 may be constructed of materials such as aluminum or stainless steel. The symmetrical spoke arrangement of the access tubes 180 is designed to further facilitate electrical and thermal symmetry of the processing apparatus 100. In one embodiment, the access tubes 180 are positioned 120 degrees apart, and each of the access tubes 180 is aligned with a respective gas tube 129. The symmetrical arrangement of the access tubes 180 further provides electrical and thermal symmetry in the chamber body 142, and particularly in the processing region 102, in order to allow greater more uniform plasma formation in the processing region 102 and improved control of the plasma density over the surface of the substrate 105 during processing.

Referring back to FIGS. 1 and 4, the evacuation passages 189 are positioned in the upper liner assembly 144 symmetrically about the central axis (CA). The evacuation passages 189 allow evacuation of gases from the processing region 102 through the evacuation region 104 and out of the chamber body 142 through an exhaust port 196. The exhaust port 196 is centered about the central axis (CA) of the chamber body assembly 140 such that the gases are evenly drawn through the evacuation passages 189. Evacuation liners 187 may be respectively positioned below each of the evacuation passages 189 in evacuation channels 188 provided in the chamber body 142 in order to protect the chamber body 142 from processing gases during evacuation. The evacuation liners 187 may be constructed of materials similar to that of the upper liner assembly 144 as described above.

The evacuation channels 188 are positioned away from the processing region 102 such that substantially no electrical interaction exists. The symmetrical positioning of the evacuation channels 188 about the central axis (CA), however, provides improved thermal and gas flow symmetry within the processing apparatus 100. For instance, the symmetrical positioning of the evacuation channels 188 about the central axis (CA), and thus the processing region 102, promotes symmetrical removal of gases from the processing region 102, resulting in symmetrical flow of gases across the substrate 105. In addition, the symmetrical positioning of the evacuation channels 188, and the evacuation liners 187, promotes symmetry in the thermal distribution in the chamber. Thus, the symmetrical positioning of the evacuation channels 188 in the processing apparatus 100 facilitates uniform plasma formation in the processing region 102 and allows greater control of the plasma density and gas flow in the processing region 102.

The exhaust assembly 190 is positioned adjacent the evacuation region 104 at the bottom of the chamber body 142. The exhaust assembly may include a throttle valve 192 coupled to a vacuum pump 194. The throttle valve 192 may be a poppet style valve used in conjunction with the vacuum pump 194 to control the vacuum conditions within the processing region 102 by symmetrically drawing exhaust gases from the processing region 102 through the evacuation passages 189 and out of the chamber through the centrally located exhaust port 196, further providing greater control of the plasma conditions in the processing region 102. A poppet style valve, as shown in FIG. 1, provides a uniform, 360 degree gap 198 through which evacuation gases are drawn through the exhaust port 196. In contrast, conventional damper-style throttle valves provide a non-uniform gap for flow of evacuation gases. For example, when the damper-style valve opens, one side of the valve draws more gas than the other side of the valve. Thus, the poppet style throttle valve has less effect on skewing gas conductance than the traditional damper-style throttle valve conventionally used in plasma processing chambers.

Again, referring to FIGS. 1 and 4, a conductive, slant mesh liner 400 is positioned in a lower portion of the upper liner assembly 144. The slant mesh liner 400 may be constructed from a conductive, process compatible material, such as aluminum, stainless steel, and/or yttria (e.g., yttria coated aluminum). The slant mesh liner 400 may have a bottom wall 402 and an outer wall 404 extending at an outward and upward angle from the bottom wall 402. The outer wall 404 may have a plurality of apertures 410 formed therethrough. The apertures 410 may be positioned symmetrically about a center axis of the slant mesh liner 400 to allow exhaust gases to be drawn uniformly therethrough, which in turn, facilitates uniform plasma formation in the processing region 102 and allows greater control of the plasma density and gas flow in the processing region 102. In one embodiment, the central axis of the slant mesh liner 400 is aligned with the central axis (CA) of the chamber body assembly 140.

The bottom wall 402 of the mesh liner 400 may be electrically coupled to the bottom wall 148 and/or the inner wall 149 of the upper liner assembly 144. Additionally, the outer wall 404 of the mesh liner 400 may be electrically coupled to the outer wall 147 of the upper liner assembly 144. When an RF plasma is present within the processing region 102, the RF current seeking a return path to ground may travel along the surface of the mesh liner 400 to the outer wall 147 of the upper liner assembly 144. Thus, the annularly symmetric configuration of the mesh liner 400 provides a symmetric RF return to ground and bypasses any geometric asymmetries in the lower portion of the upper liner assembly 400.

Therefore, embodiments of the present invention solve the problem of conventional plasma systems with the difficulty in providing uniform plasma density due to asymmetry in the chamber by providing a chamber design that allows extremely symmetrical electrical, thermal, and gas flow conductance through the chamber. By providing such symmetry, plasma formed within the chamber naturally has improved uniformity across the surface of a substrate disposed in a processing region of the chamber. This improved symmetry, as well as other chamber additions, such as providing the ability to manipulate the gap between upper and lower electrodes as well as between a gas inlet and a substrate being processed, allows better control of plasma processing and uniformity as compared to conventional systems.

While the foregoing is directed to embodiments of the present invention, other and further embodiments of the invention may be devised without departing from the basic scope thereof, and the scope thereof is determined by the claims that follow.

The invention claimed is:

1. A plasma processing apparatus, comprising:
a lid assembly and a chamber body enclosing a processing region located above a bottom wall of an upper liner and a mesh liner coupled to the bottom wall of the upper liner;
a substrate support assembly disposed in the chamber body;
an exhaust assembly defining an evacuation region within the chamber body, wherein the chamber body includes a plurality of evacuation channels symmetrically disposed about a central axis of the substrate support assembly fluidly connecting the processing region with the evacuation region, wherein the substrate support assembly comprises a lower electrode and a support pedestal disposed in a central region fluidly sealed from the processing and evacuation regions, wherein the central axis is a vertical axis; and
a plurality of access tubes positioned through the chamber body to provide access to the central region, the plurality of access tubes extending horizontally from the chamber body disposed below the support pedestal and arranged spaced apart in a spoke pattern symmetrically about the central axis of the substrate support assembly, wherein each one of the plurality of evacuation channels extends below a corresponding one of a plurality of evacuation passages positioned in the bottom wall of the upper liner, wherein each one of the plurality of evacuation channels extends between two of the plurality of access tubes, and wherein each access tube is vertically spaced apart from the processing region.

2. The apparatus of claim 1, wherein the chamber body has an exhaust port formed therethrough that is symmetric about the central axis of the substrate support pedestal.

3. The apparatus of claim 1, wherein the lid assembly comprises an upper electrode having a central manifold configured to distribute processing gas into the processing region and one or more outer manifolds configured to distribute processing gas into the processing region.

4. The apparatus of claim 3, wherein the lid assembly further comprises a ring manifold coupled to the one or more outer manifolds via a plurality of gas tubes arranged symmetrically about the central axis of the substrate support assembly.

5. The apparatus of claim 1, further comprising:
a first actuation device disposed within the central region and configured to vertically move the substrate support assembly a distance.

6. The apparatus of claim 5, wherein the distance is substantially the same as a vertical length of an opening of each of the access tubes.

7. The apparatus of claim 1, further comprising:
a second actuation device disposed within the central region and configured to vertically move a plurality of substrate support pins disposed within the substrate support assembly.

8. The apparatus of claim 1,
wherein the upper liner circumscribes the processing region, wherein the upper liner has a cylindrical wall with a plurality of slots disposed therethrough and arranged symmetrically about the central axis of the substrate support assembly.

9. The apparatus of claim 8, further comprising a backing liner coupled to the cylindrical wall covering at least one of the plurality of slots.

10. The apparatus of claim 8, wherein the mesh liner is annularly disposed about the substrate support assembly and is electrically coupled to the upper liner.

11. The apparatus of claim 10, wherein the mesh liner has a plurality of apertures disposed therethrough and arranged symmetrically about a central axis of the mesh liner.

12. A plasma processing apparatus, comprising:
a lid assembly and a chamber body enclosing a processing region located above a bottom wall of an upper liner and a mesh liner coupled to the bottom wall of the upper liner, wherein the lid assembly comprises:
an upper electrode having a central manifold configured to distribute processing gas into the processing region and one or more outer manifolds configured to distribute processing gas into the processing region; and
a ring manifold coupled to the one or more outer manifolds via a plurality of gas tubes arranged symmetrically about a vertical axis; and
a substrate support assembly disposed in the chamber body about a central axis co-linear with the vertical axis, wherein the substrate support assembly comprises:
a lower electrode and a support pedestal disposed in a central region of the chamber body fluidly sealed from the processing region; and
a plurality of access tubes positioned through the chamber body to provide access to the central region, the plurality of access tubes extending horizontally from the chamber body disposed below the support pedestal and arranged spaced apart in a spoke pattern symmetrically about the central axis of the substrate support assembly;
a plurality of evacuation passages positioned in the bottom wall of the upper liner symmetrically disposed about the central axis of the substrate support assembly; and
a plurality of evacuation channels symmetrically disposed in the chamber body, each extending below a corresponding one of the plurality of evacuation passages between two of the plurality of access tubes, wherein each access tube is vertically spaced apart from the processing region.

13. The apparatus of claim 12, wherein the substrate support assembly comprises
a first actuation device disposed within the central region and configured to vertically move the substrate support assembly a distance.

14. The apparatus of claim 13, wherein the distance is substantially the same as a vertical length of an opening of each of the access tubes.

15. The apparatus of claim 13, further comprising a second actuation device disposed within the central region and configured to vertically move a plurality of substrate support pins disposed within the substrate support assembly.

16. A plasma processing apparatus, comprising:
a lid assembly and a chamber body enclosing a processing region located above a bottom wall of an upper liner and a mesh liner coupled to the bottom wall of the upper liner;
a substrate support assembly disposed in the chamber body, wherein the substrate support assembly comprises:
a lower electrode and a support pedestal disposed in a central region of the chamber body fluidly sealed from the processing region; and
a plurality of access tubes positioned through the chamber body to provide access to the central region, the plurality of access tubes extending horizontally from the chamber body disposed below the support pedestal and arranged spaced apart in a spoke pattern symmetrically about a central axis of the substrate support assembly, wherein the central axis is a vertical axis;
a plurality of evacuation passages positioned in the bottom wall of the upper liner symmetrically disposed about the central axis of the substrate support assembly;
a plurality of evacuation channels symmetrically disposed in the chamber body, each extending below a corresponding one of the plurality of evacuation passages between two of the plurality of access tubes, wherein each access tube is vertically spaced apart from the processing region, wherein the upper liner circumscribes the processing region, wherein the upper liner has a cylindrical wall with a plurality of slots disposed therethrough and arranged symmetrically about the central axis of the substrate support assembly, and wherein the mesh liner is annularly disposed about the substrate support assembly and is electrically coupled to the upper liner; and a backing liner coupled to the cylindrical wall and covering at least one of the plurality of slots.

17. The apparatus of claim 16, wherein the substrate support assembly comprises a first actuation device disposed within the central region and configured to vertically move the substrate support assembly a distance.

\* \* \* \* \*